United States Patent
Liao et al.

(10) Patent No.: US 10,041,817 B2
(45) Date of Patent: Aug. 7, 2018

(54) DAMPING COMPONENT AND INTEGRATED-CIRCUIT TESTING APPARATUS USING THE SAME

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Taipei (TW); Yu-Min Sun, New Taipei (TW); Chih-Feng Cheng, Taoyuan (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/397,754

(22) Filed: Jan. 4, 2017

(65) Prior Publication Data
US 2018/0087936 A1    Mar. 29, 2018

(30) Foreign Application Priority Data
Sep. 26, 2016   (CN) .......................... 2016 1 0849372

(51) Int. Cl.
| G01D 11/12 | (2006.01) |
|---|---|
| B60T 17/08 | (2006.01) |
| G01R 31/44 | (2006.01) |
| G01R 31/26 | (2014.01) |

(52) U.S. Cl.
CPC ............. *G01D 11/12* (2013.01); *G01R 31/26* (2013.01); *G01R 31/44* (2013.01)

(58) Field of Classification Search
CPC ...................................................... G01D 11/12
USPC ..................................................... 73/431, 430
See application file for complete search history.

(56) References Cited

U.S. PATENT DOCUMENTS

| 6,669,309 B1 * | 12/2003 | Gierer ..................... F16L 55/05 138/30 |
| 2009/0173588 A1 * | 7/2009 | Gelbard .................. F16F 9/003 188/269 |

FOREIGN PATENT DOCUMENTS

| CN | 1424724 A | 6/2003 |
| CN | 204252314 U * | 4/2015 |
| CN | 105293064 A | 2/2016 |
| DE | 3325329 A1 * | 1/1985 ............. G01D 11/12 |

* cited by examiner

*Primary Examiner* — Harshad R Patel
*Assistant Examiner* — Jamel Williams
(74) *Attorney, Agent, or Firm* — CKC & Partners Co., Ltd.

(57) ABSTRACT

An embodiment of the present disclosure provides a damping component. The damping component includes a housing, at least one sliding piece, a fluid, and at least one damping elastomer. The housing may have at least one opening. The sliding piece slidably seals the opening, and partially protrudes outside the opening, to form an accommodation space within the housing. The fluid can fill up the accommodation space. The damping elastomer can be disposed inside the accommodation space.

9 Claims, 3 Drawing Sheets

DAMPING COMPONENT AND INTEGRATED-CIRCUIT TESTING APPARATUS USING THE SAME

RELATED APPLICATIONS

This application claims priority to Chinese application No. 201610849372.0, filed Sep. 26, 2016, which is herein incorporated by reference.

BACKGROUND

Field of Invention

The present disclosure relates to a damping component. More particularly, the present disclosure relates to a damping component adopted in an integrated-circuit (IC) testing apparatus.

Description of Related Art

With electronic products becoming more wide-spreading and gain more demands, demands for electronic components used to assemble the electronic products accordingly increase, especially the semiconductor components such as chips and likes applied in most of the electronic products. Owing to the great increase in demands for the semiconductor components, traditional production lines for the semiconductor components are gradually automated in fabrication, so as the semiconductor manufacture processes, such as fabrication of integrated-circuits, packaging integrated-circuits, and testing processes . . . etc. However, vibration from the IC testing apparatus may greatly influence the connection of fine external terminals of a semiconductor component with contact pads of the chip-testing socket in conducting a testing process. To reduce the vibration, the IC testing apparatus may adopt fixed frame structures, so as to prevent the connection of the semiconductor component and the chip-testing socket from the vibration in the testing, so as to avoid the vibration back influencing the connection of the semiconductor component and the chip-testing socket through the IC testing apparatus. Although, the amplitude of vibration can be reduced over time, the vibration would still last for a period of time before being totally eliminated. As a consequence, vibration of the IC testing apparatus increases the abrasion of the components installed inside the IC testing apparatus, which may also diminish life-cycle of the components. Furthermore, the abrasion of the components would increase the maintenance demand, which increases the operating costs of the IC testing apparatus. Therefore, to reduce the abrasion of the IC testing apparatus and the accompanying time consuming and part costs for overhauling the IC testing apparatus, there apparently exists inconvenience and defects for the typical IC testing apparatus and further improvements are required. The ordinarily skilled artisans have striven to attain a solution, but the problem still lacks a suitable solution to be developed. Therefore, it is an import subject of research and development to deal with the aforesaid problem effectively, which need further improvements.

SUMMARY

The present disclosure provides a damping component for receiving an external force and eliminating the external force. The damping component adopts a sliding piece to receiving the external force, and then the force may further be transmitted to a fluid and a damping elastomer inside a housing of the damping component through the sliding piece, in which the sliding piece is slidably sealing the housing. Subsequently, the oscillation of the fluid and the sliding piece induced by the force may undergo a damping oscillation while the sliding piece and the damping elastomer have different damping coefficients, such that the amplitude of the oscillation can be eliminated or absorbed rapidly. Consequently, the force is also eliminated or absorbed.

The present disclosure provides a damping component. The damping component includes a housing, at least one sliding piece, a fluid, and at least one damping elastomer. The housing has at least one opening. The sliding piece is slidably sealing the opening and partially protruded outside the opening. The sliding piece and the housing collectively form an accommodation space within the housing. The accommodation space is filled up with the fluid. The damping elastomer is disposed inside the accommodation space.

The present disclosure provides an IC testing apparatus. The IC testing apparatus includes at least one damping component, a chip-testing socket, and a chip-mounting component. The damping component includes a housing, at least one sliding piece, a fluid, and at least one damping elastomer. The housing has at least one opening. The sliding piece is slidably sealing the opening and partially protruded outside the opening. The sliding piece and the housing collectively form an accommodation space within the housing. The accommodation space is filled up with the fluid. The damping elastomer is disposed inside the accommodation space. The chip-testing socket is connected with the damping component. The chip-mounting component is disposed over the chip-testing socket, and connected to the damping component. The chip-mounting component can receive a chip, and move the chip to contact with the chip-testing socket.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
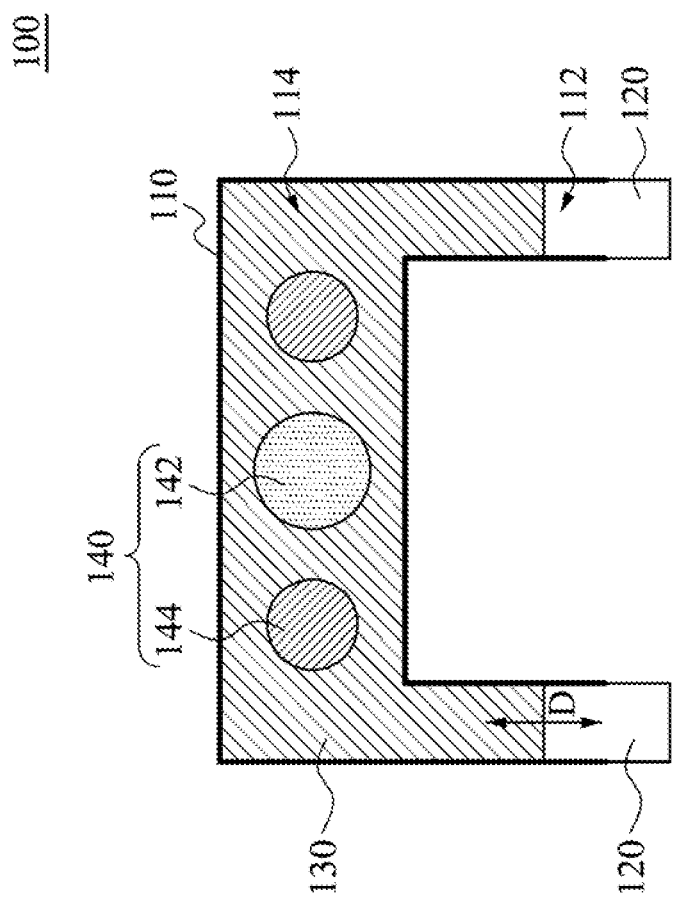
FIG. 1 is a simplified sectional view of a damping component according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Reference is made to FIG. 1. FIG. 1 illustrates a simplified sectional view of a damping component 100 according to some embodiments of the present disclosure. As shown in FIG. 1, in some embodiments, the damping component 100 may include a housing 110, sliding pieces 120, a fluid 130, and at least one damping elastomer 140. In some embodiments, the housing 110 has at least one opening 112. The sliding piece 120 can be slidably sealing the opening 112, and partially protruded outside the opening 112. That is, the sliding piece 120 and the housing 110 can collectively form an accommodation space 114 within the housing 110. In some embodiments, the sliding piece 120 can be moved within the housing 110 along the moveable direction D. The fluid 130 can fill up the accommodation space 114. In some embodiments, the fluid 130 can be an incompressible fluid. In some embodiments, the fluid can be a lubricant fluid, such as oil or other suitable fluid. The damping elastomer 140 is disposed inside the accommodation space 114. In some embodiments, the damping elastomer 140 can be sphere, so that the pressure variation received from the fluid 130 can be evenly distributed. In some embodiments, the damping elastomer 140 can be a damping ball.

When a force exerts on the sliding piece 120, the force may drive the sliding piece 120 to push the fluid 130; and then, the force would be transmitted into the fluid 130, and further transmitted to the damping elastomer 140. Therefore, the force exerted on the damping component 100 would be absorbed and eliminated through the fluid 130 and the damping elastomer 140; and moreover, the damping component 100 can avoid the force being spread to other components connected with the damping component 100. To be more specifically, owing to the damping coefficients of the fluid 130 and the damping elastomer 140 are different, the amplitude of an oscillation induced by the force may undergo a combined damping oscillation. The amplitude of the oscillation induced by the force would be rapidly diminished over time. That is, a force transmitted to the damping component 100 from other component can be absorbed or eliminated by the damping component 100.

In some embodiments, the damping component 100 may further include some of the damping elastomers 140, and the elastic coefficients of the damping elastomers 140 are varied. In some embodiments, the damping elastomers 140 may include at least one first damping elastomer 142 and at least one second damping elastomer 144. The elastic coefficient of the first damping elastomer 142 is greater than the elastic coefficient of the second damping elastomer 144. In some embodiments, the second damping elastomer 144 is located between the opening 112 and the first damping elastomer 142. Therefore, when a force is transmitted to the first damping elastomer 142 and the second damping elastomer 144 with varied elastic coefficients, an amplitude of an oscillation in the damping component 100 induced by the force may be diminished over time more rapidly under a combined damping oscillation. For example, combination of the first damping elastomer 142 and the second damping elastomer 144 may responsively induce an under-damping oscillation, a critical-damping oscillation, and/or an over-damping oscillation while a force exerts on the damping component 100. Therefore, the amplitude of the oscillation in the damping component 100 induced by the force may be converged rapidly, and the force generated from other component can be absorbed or eliminated more rapidly through the damping component 100.

In some embodiments, the damping component 100 may further include two of the sliding pieces 120 and two of the second damping elastomers 144. The housing 110 may further have two openings 112. In some embodiments, the second damping elastomers 142 can be located between the openings 112 and the first damping elastomer 142. It should be noted that the location of the opening 112, the moveable direction D of the sliding piece 120, and the shape and the quantity of the damping elastomers 140, described herein, are only an exemplary, and not intended to limit the present disclosure. For example, the two openings 112 can opposite to each other, and the moveable direction D may extend along a straight line. For example, the extended lines of the fringe of the openings 112 may have a non-zero inter-angle, the sliding pieces 120 can slide along directions of the openings 112 respectively. For example, the housing 110 may have three or more openings 112, the sliding pieces 120 can also slide along directions of the openings 112 respectively. For example, the damping component 100 can include more damping elastomers 140. For example, the damping elastomers 140 can be elliptic. It should be understood that various changes, substitutions, and alterations can be made herein without departing from the spirit and scope of the disclosure. The prerequisites is that the sliding piece 120 can transmit an external force to the fluid 130 and the damping elastomers 140, and the fluid 130 and the damping elastomers 140 can absorb or eliminate the force.

Figure 2:
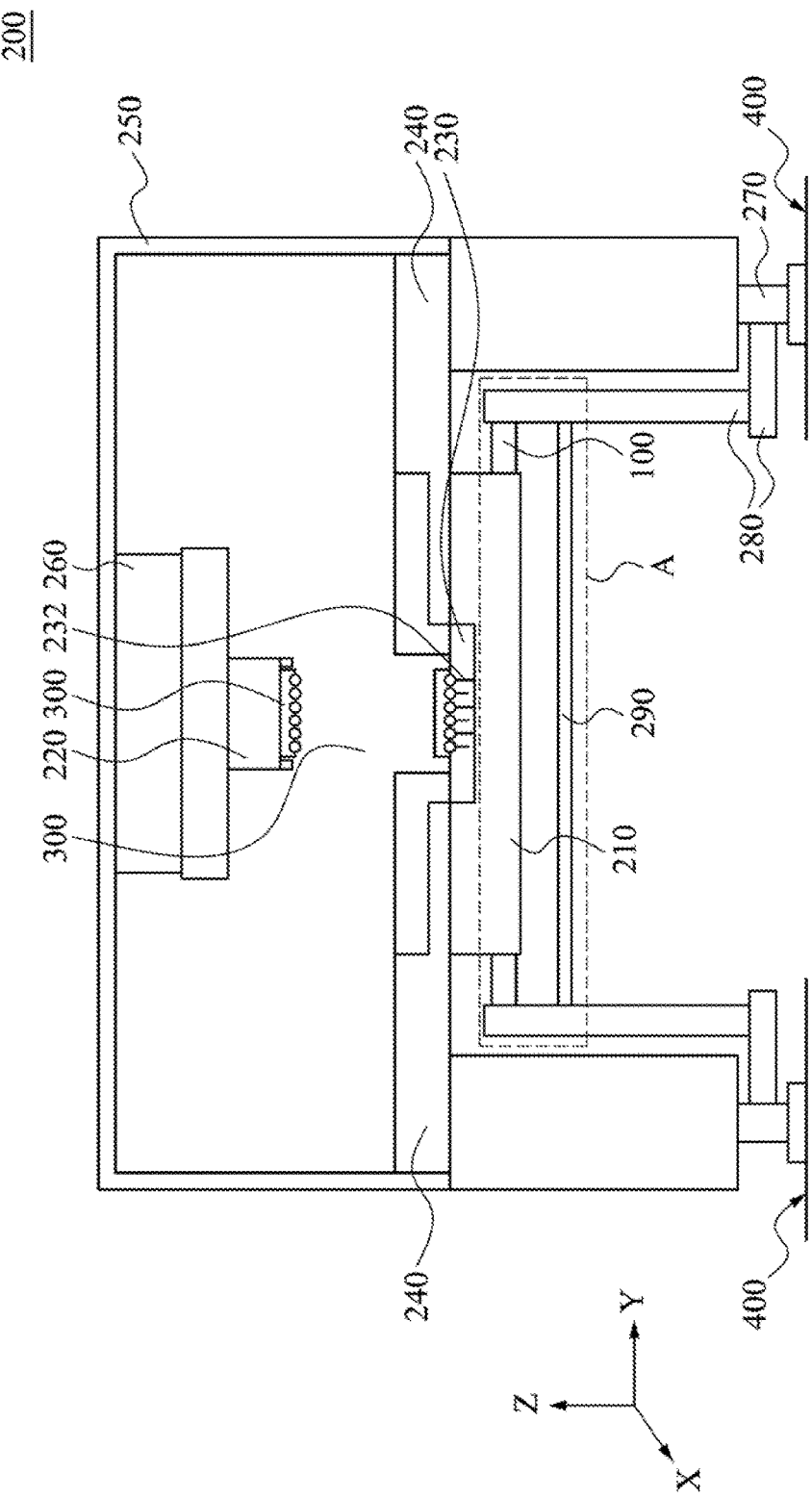
FIG. 2 is a simplified longitudinal sectional view of an IC testing apparatus according to some embodiments of the present disclosure.
Figure 3:
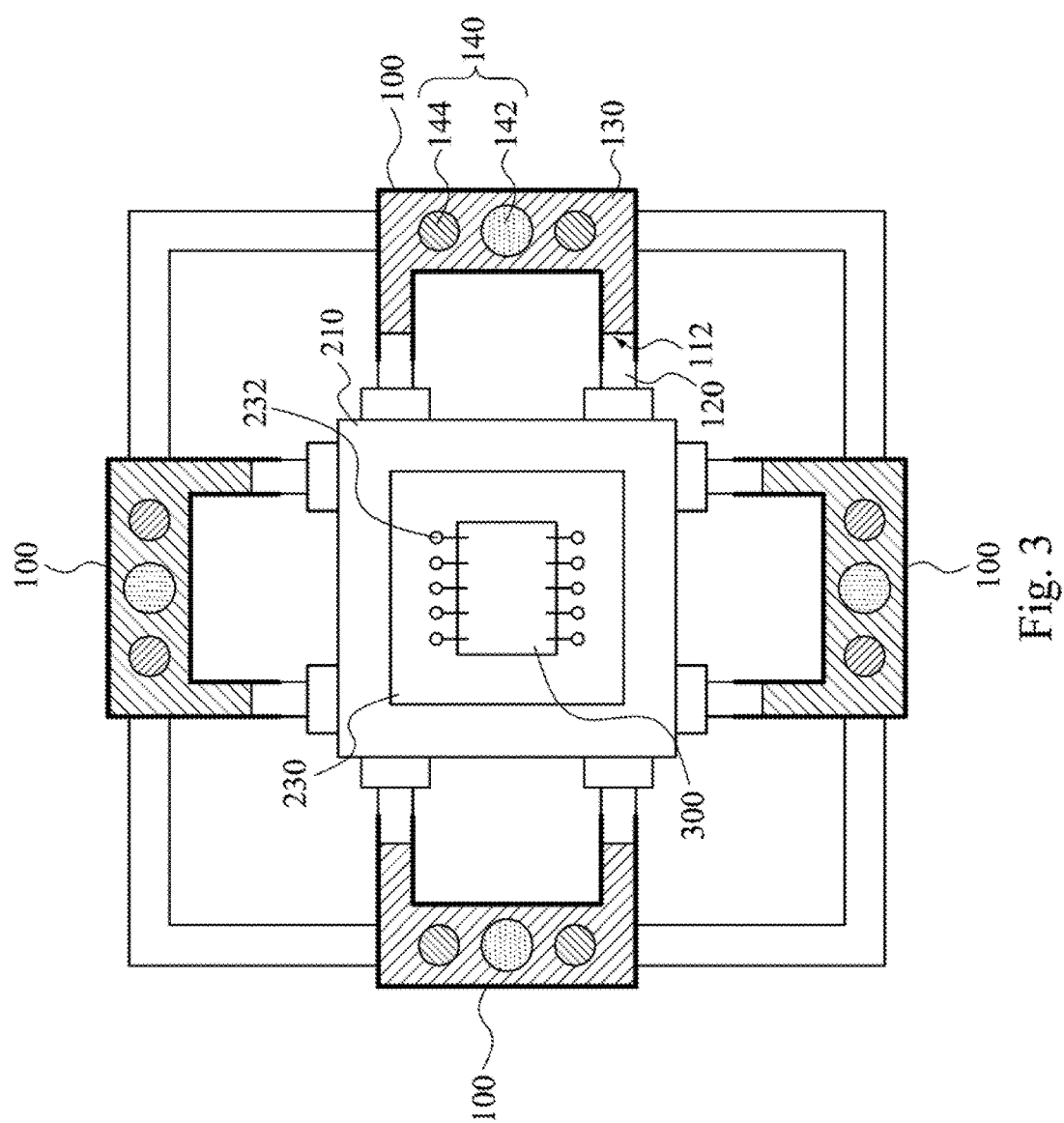
FIG. 3 is a simplified fragmentary view of an IC testing apparatus according to some embodiments of the present disclosure.

Reference is made to FIGS. 2 and 3. FIG. 2 illustrates a simplified longitudinal sectional view of an IC testing apparatus 200 according to some embodiments of the present disclosure. FIG. 3 illustrates a simplified fragmentary view of an IC testing apparatus 200 within a dotted-line frame A in FIG. 2 according to some embodiments of the present disclosure. Referring to FIGS. 2 and 3, in some embodiments, the IC testing apparatus 200 may include at least one damping component 100, a handler chassis 240, a chip-testing socket 230, and a chip-mounting component 220. The chip-testing socket 230 is connected with the damping component 100. More specifically, in some embodiments, the handler chassis 240 may include a load board 210 extended from the handler chassis 240. The chip-testing socket 230 can couple with the load board 210, and further be connected to the sliding piece 120 of the damping component 100 through the load board 210. The sliding piece 120 can receive forces transmitted from the load board 210 or other components, such as a moveable arm 260 and a second connecting rod 290 of the IC testing apparatus 200 . . . etc., and the sliding piece 120 may further transmit the forces to the fluid 130 and the damping elastomers 140.

In some embodiments, the chip-mounting component 220 is disposed over the chip-testing socket 230. The chip-mounting component can receive a chip 300, and be adopted to move the chip 300 to contact with a pogo-pin platform 232 of the chip-testing socket 230. In some embodiments, the IC testing apparatus 200 may further include the moveable arm 260. The moveable arm 260 is connected with the chip-mounting component 220 and the load board 210; and may further be connected to the damping component 100 through the load board 210. The moveable arm 260 can move the chip-mounting component 220 in X-Y-Z direction to adjust the horizontal location of the chip-mounting component 220 and the distance between the chip-mounting component 220 and the chip-testing socket 230, so as to make the chip 300 contact with the chip-testing socket 230, especially contact with the contact point of the pogo-pin platform 232 correctly. However, some forces may be generated while the moveable arm 260 moves the chip-mounting component 220 and the chip 300, and the forces can be transmitted to the sliding piece 120 of the damping component 100 through the load board 210. In other embodiments, the forces generated by the movements of the chip-mounting component 220 can be transmitted to the sliding piece 120 through an outer frame 250, the handler chassis 240, and the load board 210 . . . etc.

Owing to the forces generated by the movements of the chip-mounting component 220 can further be transmitted into the fluid 130 through the sliding piece 120; and moreover, the forces can be transmitted to a damping complex including the fluid 130 and the damping elastomers 140, in which the forces can be absorbed or eliminated rapidly. More specifically, owing to the damping coefficients of the fluid 130 and the damping elastomer 140 being different, the amplitude of an oscillation induced by the forces may undergo a damping oscillation. The amplitude of the oscillation induced by the forces in the damping component 100 would be rapidly diminished over time, such that the forces generated by the IC testing apparatus 200 can be absorbed or eliminated by the damping component 100. Therefore, the damping component 100 can prevent or diminish the forces from transmitting to other components of the IC testing apparatus 200, such as the chip-testing socket 230 . . . etc.; and moreover, the stability of the contact between the chip 300 and the pogo-pin platform 232 of the chip-testing socket 230 can be secured and enhanced.

In addition, when the IC testing apparatus 200 repetitively executes testing processes, the damping component 100 may decrease the abrasion rate of the IC testing apparatus 200 while the self-generated forces can be absorbed or eliminated rapidly. Therefore, life-cycle of components disposed within the IC testing apparatus 200 can be extended, and maintenance cost of the IC testing apparatus 200 may further be decreased.

As shown in FIG. 2, in some embodiments, the IC testing apparatus 200 may further includes a supporting base 270. The supporting base 270 can be installed on a fixed plane 400 or a solid ground. The damping component 100 is connected to the supporting base 270. In some embodiments, the IC testing apparatus 200 may further includes a first connecting rod 280, connecting between the supporting base 270 and the damping component 100. Therefore, the supporting base 270 can be adopted to enhance the stability of the damping component 100, and the stability of the IC testing apparatus 200 can also be enhanced.

Referring to FIGS. 2 and 3, in some embodiments, the IC testing apparatus 200 may further include some of the damping components 100. For example, four of the damping components 100 can be installed in the IC testing apparatus 200, but not intended to limit the present disclosure, the quantity of the damping components 100 can be adjusted for actual demand. The IC testing apparatus 200 may further includes a second connecting rod 290, connecting the damping components 100 with each other. Therefore, the force exerted on a plane, which is parallel to the load board 210, can be distributed and transmitted to the damping components 100 through the second connecting rod 290, the damping components 100 can assist each other absorbed or eliminated forces.

Summarized from the above, some embodiments of the present disclosure provide a damping component. The damping component includes a housing, at least one sliding piece, a fluid, and at least one damping elastomer. The housing has at least one opening. The sliding piece is slidably sealing the opening and partially protruded outside the opening. The sliding piece and the housing collectively form an accommodation space within the housing. The accommodation space is filled up with the fluid. The damping elastomer is disposed inside the accommodation space. The sliding piece can be adopted to receive external force and further transmit to the fluid and the damping elastomer to generate oscillation. Owing to the oscillation undergo a damping oscillation induced by the fluid and the damping elastomer with different damping coefficients, the amplitude of the oscillation generated by the external force can be reduced and absorbed rapidly.

Other embodiments of the present disclosure further provide an IC testing apparatus. The IC testing apparatus includes at least one damping component, a chip-testing socket, and a chip-mounting component. The chip-testing socket is connected with the damping component. The chip-mounting component is disposed over the chip-testing socket, and connected to the damping component. The chip-mounting component can receive a chip, and move the chip to contact with the chip-testing socket. The sliding piece of the damping component can receive force generated by the chip-mounting component, and further transmit to the fluid and the damping elastomer to generate oscillation. Subsequently, the oscillation undergo a damping oscillation induced by the fluid and the damping elastomer with different damping coefficients, the amplitude of the oscillation generated by the external force can be reduced and absorbed rapidly. Therefore, the damping component can increase the stability of the coupling of the chip-testing socket and the chip-mounting component Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabricate, composition of matter, means, methods, and steps described in the specification. As one of ordinary skill in the art will readily appreciate from the disclosure of the present disclosure, processes, machines, fabricate, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabricate, compositions of matter, means, methods, or steps.

What is claimed is:

1. A damping component comprising:
   a housing having two openings;
   two sliding pieces, each of the sliding pieces slidably sealing one of the openings and partially protruded outside the one of the openings, to form an accommodation space within the housing;
a fluid filled up the accommodation space; and
a plurality of damping elastomers disposed inside the accommodation space, wherein the damping elastomers comprise at least one first damping elastomer and two second damping elastomers, wherein an elastic coefficient of the first damping elastomer is greater than an elastic coefficient of each of the second damping elastomers, and the second damping elastomers are individually located between the openings and the first damping elastomer.

2. The damping component of claim 1, wherein the shape of each of the damping elastomers is sphere.

3. The damping component of claim 1, wherein the fluid is an incompressible fluid.

4. An IC testing apparatus comprising:
the damping component of claim 1;
a chip-testing socket connected with the damping component; and
a chip-mounting component disposed over the chip-testing socket, and connected to the damping component, wherein the chip-mounting component is configured to receive a chip, and move the chip to contact with the chip-testing socket.

5. The IC testing apparatus of claim 4, wherein the shape of each of the damping elastomers is sphere.

6. The IC testing apparatus of claim 4, wherein the fluid is an incompressible fluid.

7. The IC testing apparatus of claim 4, further comprising:
a supporting base installed on a fixed plane, wherein the damping component is connected to the supporting base.

8. The IC testing apparatus of claim 7, further comprising:
a first connecting rod connecting between the supporting base and the damping component.

9. The IC testing apparatus of claim 4, further comprising:
a moveable arm, connected with the chip-mounting component and the damping component, wherein the moveable arm is configured to adjust the horizontal location of the chip-mounting component and the distance between the chip-mounting component and the chip-testing socket, to move the chip to contact with the chip-testing socket.

* * * * *